United States Patent [19]
Sakuma

[11] Patent Number: 5,157,001
[45] Date of Patent: Oct. 20, 1992

[54] METHOD OF DICING SEMICONDUCTOR WAFER ALONG PROTECTIVE FILM FORMED ON SCRIBE LINES

[75] Inventor: Masahiro Sakuma, Zyouetsu, Japan

[73] Assignee: Matsushita Electric Industrial Co., Ltd., Osaka, Japan

[21] Appl. No.: 583,185

[22] Filed: Sep. 14, 1990

[30] Foreign Application Priority Data

Sep. 18, 1989 [JP] Japan .................. 1-241287
Oct. 23, 1989 [JP] Japan .................. 1-276573

[51] Int. Cl.⁵ .......................................... H01L 21/80
[52] U.S. Cl. .................................... 437/227; 437/946
[58] Field of Search ............. 437/226, 227, 946, 925; 148/DIG. 28; 156/250

[56] References Cited

U.S. PATENT DOCUMENTS

| | | | |
|---|---|---|---|
| 3,838,501 | 10/1974 | Umbaugh | 437/226 |
| 4,446,194 | 5/1984 | Candelaria et al. | 437/235 |
| 4,563,227 | 1/1986 | Sakai et al. | 437/69 |
| 4,729,816 | 3/1988 | Nguyen et al. | 437/226 |
| 4,804,641 | 2/1989 | Arlt et al. | 148/DIG. 28 |

FOREIGN PATENT DOCUMENTS

| | | | |
|---|---|---|---|
| 2572218 | 10/1984 | France | 437/227 |
| 53-5973 | 1/1978 | Japan | 437/226 |
| 63-23068 | 2/1988 | Japan | |

Primary Examiner—Olik Chaudhuri
Assistant Examiner—Ourmazd S. Ojan
Attorney, Agent, or Firm—Ratner & Prestia

[57] ABSTRACT

According to the invention, a protective film which is separated from an integrated circuit part and partly buried in the semiconductor wafer is formed in the surface region of semiconductor wafer along a scribing line between adjacent integrated circuit parts. Upon cutting or dicing along the scribing lines, a portion of the protective film may remain along the edges thereof. Thus, the periphery of the semiconductor chips produced by dicing is protected by the protective film, and if an external force is applied to the periphery of the semiconductor chip in the dicing process or die-bonding process, the force is absorbed by the protective film and is hence lessened. Especially in this invention, since the protective film formed along the scribing line is formed as being separated from the integrated circuit part, and partly buried in the semiconductor wafer, the external force applied to other semiconductor wafer is fully suppressed by the protective film, and the integrated circuit part may be effectively prevented from cracking. Accordingly the yield (productivity) of the process and the reliability of the semiconductor device may both be enhanced.

1 Claim, 4 Drawing Sheets

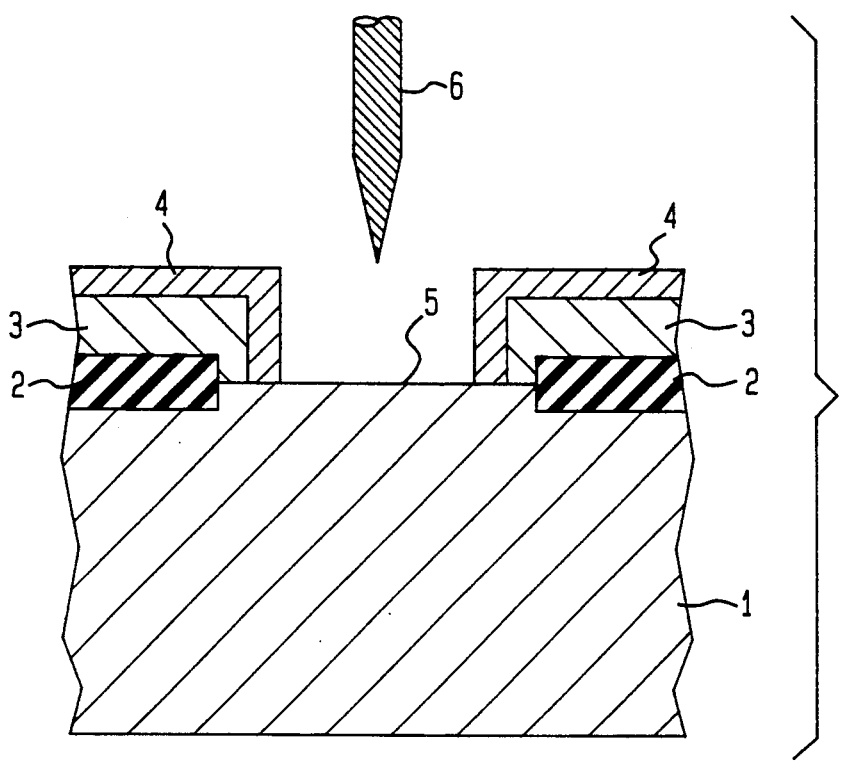
FIG. 5
(PRIOR ART)
FIG. 6
(PRIOR ART)
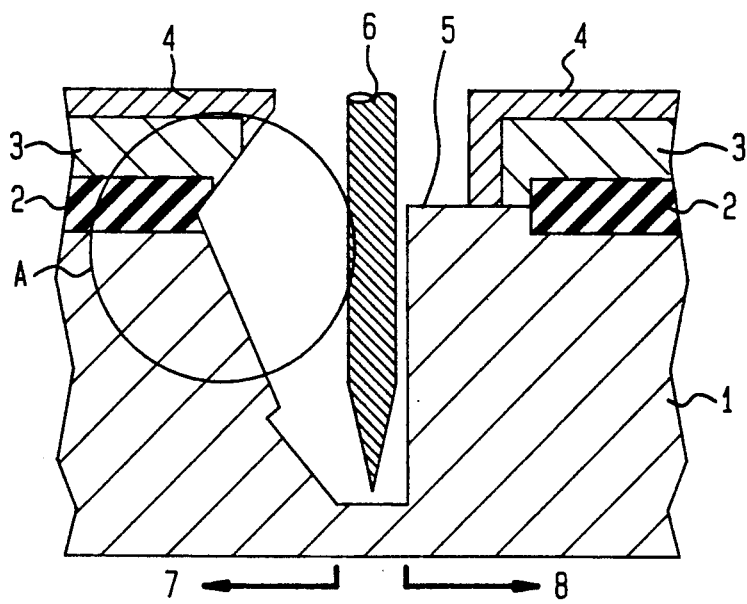

5,157,001

METHOD OF DICING SEMICONDUCTOR WAFER ALONG PROTECTIVE FILM FORMED ON SCRIBE LINES

BACKGROUND OF THE INVENTION

The present invention relates to a semiconductor device and a manufacturing method therefor, and more particularly to a semiconductor device capable of being diced and die-bonded stably and a manufacturing method to make such devices.

Recently, as electronic appliances have become more compact, semiconductor chips used therein have also been required to become more compact and the scale of integration required has become larger. In this trend, the spacing between semiconductor elements in a semiconductor chip, and the width of scribing line defined between adjacent semiconductor chips are being narrowed. Furthermore, peripheral circuits and aluminum wirings on the semiconductor chip are often formed at a position extremely close to the marginal edge of the semiconductor chip.

FIG. 5 and FIG. 6 show a conventional semiconductor device dicing method.

As shown in FIG. 5 and FIG. 6, on the surface of a semiconductor wafer 1, an oxide film for semiconductor element isolation (so-called LOCOS oxide film) 2 is selectively formed. In the region separated by the oxide film 2 on the surface of semiconductor wafer 1, transistors, capacitors and other semiconductor elements are formed. Individual semiconductor elements are not shown in the drawings, and these semiconductor elements and the wiring for connecting them are collectively expressed as a semiconductor element region 3. On the surface of semiconductor element region 3, a protective film 4 composed of oxide film, nitride film or the like is formed. Between adjacent semiconductor element regions 3, 3, scribing line 5 is defined in order to divide the semiconductor wafer 1 into plural square-shaped semiconductor chips.

Accordingly, by rotating a dicing saw 6 composed of a disk-shaped blade having a diamond attached to the tip, at high speed, when the semiconductor wafer 1 is cut along the center line of the scribing lines 5 while moving in the direction orthogonal to the sheet of paper, the semiconductor wafer 1 can be divided into plural semiconductor chips 7, 8.

However, when the semiconductor wafer 1 is cut in this manner, since the hardness of the scribing line 5 is high, the dicing saw 6 applies an immoderate force to the semiconductor wafer I, and as a result cracks are formed in the peripheral portion of scribing line 5 as shown in FIG. 6. When the cracks propagate up to the oxide film 2, semiconductor element region 3 or protective film 4 as indicated by circle A in FIG. 6, the water (not shown) supplied to the semiconductor wafer 1 in order to cool off the heat generated due to high speed rotation and movement of the dicing saw 6 invades in to the crack area. Consequently, the reliability of the manufactured semiconductor chip is lowered. Such problem is more serious when the width of the scribing lines 5 is narrowed for the purpose of making finer structure and larger scale integration of semiconductor chips for miniaturizing electronic appliances.

Incidentally, conforming semiconductor chips separated from the semiconductor wafer 1 in the above dicing process may be adhered to a lead frame in a subsequent die-bonding process.

FIG. 7 and FIG. 8 relate to a conventional die-bonding method. In FIG. 7, the lower surface of a collet 9 is formed in a pyramidal shape, and a pipe 10 is affixed in the middle of the collet 9. On the surface of the semiconductor chip 8, an integrated circuit part 11 comprising oxide film 2, semiconductor element region 3 and protective film 4, as shown in FIG. 5 and FIG. 6, is formed. A part of scribing lines 5 is left over around the integrated circuit part 11.

Die-bonding is performed in the following manner. In the first place, the collet 9 is moved onto the conforming semiconductor chip 8 separated by the dicing process, and the air in the lower surface of the collet 9 is extracted in the direction of arrow B by vacuum means comprising a pipe 10 and a vacuum pump (not shown) attached to the upper end of the pipe 10. As a result, the semiconductor chip 8 is attracted to the lower surface of the collet 9, with the vicinity of the peripheral ridge of the semiconductor substrate in contact with the slope of the collet 9. Therefore, the integrated circuit part 11 does not contact with the collet 9. In this state, the collet 9 is moved onto the lead frame 12, and the semiconductor chip 8 is mounted on the lead frame 12. The surface of the lead frame 12 is preliminarily coated with an adhesive (not shown) such as silver paste. Then, as shown in FIG. 8, by shaking (or vibrating) the collet 9 in the directions of arrows C, D in FIG. 8 while pressing the semiconductor chip 8 onto the lead frame 12 by the collet 9, that is, by, so to speak, scrubbing, the semiconductor chip 8 is adhered to the lead frame 12.

At this time, since a force is directly applied to the peripheral edge of the semiconductor chip 8 by the slope of the collet 9, a crack may be formed from the vicinity of the edge of the semiconductor chip 8 to the inside of the semiconductor substrate as indicated by circle E in FIG. 8. In particular, when integrated circuit part 11 is formed with its periphery close to the outermost periphery of the semiconductor chip 8 (that is, when the scribing line 5 is narrow), or when the aluminum wirings in the integrated circuit part 11 are formed closely to the outermost periphery of the integrated circuit part 11, the cracks formed in the semiconductor substrate may reach up to the inside of the integrated circuit part 11. If the edge of the semiconductor chip 8 is broken, meanwhile, as shown in FIG. 9, the edge of the integrated circuit part 11 is pressed against the slope of the collet 9, and hence the integrated circuit part 11 may be directly destroyed.

Moreover, if cracks are formed in the scribing lines 5 or in the integrated circuit part 11, water may invade through the interface of the integrated circuit part 11 and semiconductor substrate, and therefore the reliability of the semiconductor device is lowered.

In the manufacturing methods of conventional semiconductor devices, as described herein, cracks are likely to be formed in the semiconductor substrate or other parts, whether in the scribing process or in the die-bonding process, and accordingly, production yield is lowered, or the reliability of the semiconductor device is lowered due to reduced humidity resistance.

It is hence a primary object of the invention to present a semiconductor device and a manufacturing method therefor capable of solving such conventional problems.

It is a first object of the invention to present a semiconductor device which is less likely to cause cracks in the semiconductor substrate in the scribing process or die-bonding process.

It is a second object of the invention to present a semiconductor device manufacturing method comprising a dicing step which is less likely to cause cracks in the semiconductor substrate.

It is a third object of the invention to present a semiconductor device manufacturing method comprising a die-bonding process which is less likely to cause cracks in the semiconductor substrate.

Meanwhile, the present applicant filed the Japanese patent application No. Sho. 63-23068 (Laid-open Patent No. Hei. 01-196850) to the Japanese Patent Office on Feb. 2, 1988, and the present application is a further improved version of the foregoing invention.

SUMMARY OF THE INVENTION

The semiconductor device of the invention has a protective film which is separated from the integrated circuit part and partly buried in the surface region of a semiconductor wafer along scribing lines.

The semiconductor device manufacturing method of the invention includes a dicing step of forming a protective film which is separated from the integrated circuit part and partly buried in the surface region of semiconductor wafer along the scribing lines, and cutting the protective film and semiconductor wafer along the center line of scribing lines by a dicing saw so as to divide the semiconductor wafer into plural semiconductor chips.

Furthermore, the semiconductor device manufacturing method of the invention includes a die-bonding step of attracting the semiconductor chip having a protective film formed on its outermost circumference by a collet having the lower surface formed in a pyramidal shape, and pressing the semiconductor chip on to a lead frame surface, with pressure applied by the collet so as to adhere the semiconductor chip to the lead frame.

According to the invention, since the surrounding edge of the semiconductor chip is protected by the protective film, even if a force is applied to the periphery of the semiconductor chip in the dicing step or die-bonding step, the force is absorbed by the protective film, and propagation of the force to the inside of the semiconductor substrate may be prevented. Particularly in this invention, since the protective film is formed separate from the integrated circuit part and a part of the protective film is buried in the surface region of the semiconductor wafer, the force applied to the protective film is fully absorbed by the protective film, and therefore, the propagation of force to the integrated circuit part may be effectively inhibited. As a result, the semiconductor substrate or integrated circuit part may be securely prevented from cracking, and the yield (productivity) of the semiconductor device manufacturing process and the reliability of the product may both be enhanced.

BRIEF DESCRIPTION OF THE DRAWINGS

FIG. 5 and FIG. 6 are sectional views showing a conventional dicing method; and

DETAILED DESCRIPTION OF THE INVENTION

Figure 1:
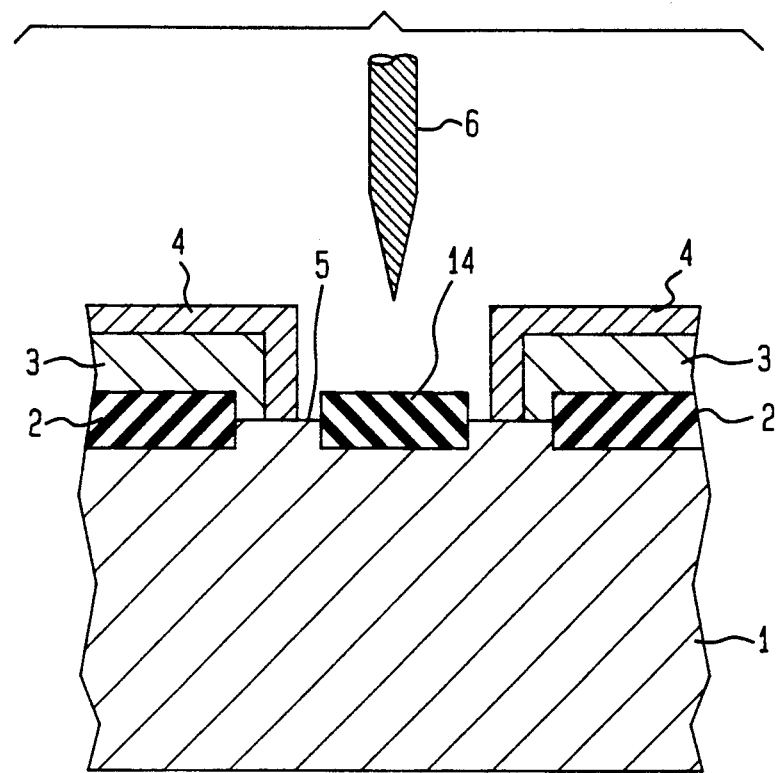
FIG. 1 and FIG. 2 are sectional views showing a semiconductor device manufacturing method in a first embodiment of the invention.

Referring now to the drawings, some of the embodiments of the invention are described in detail below.

Figure 2:
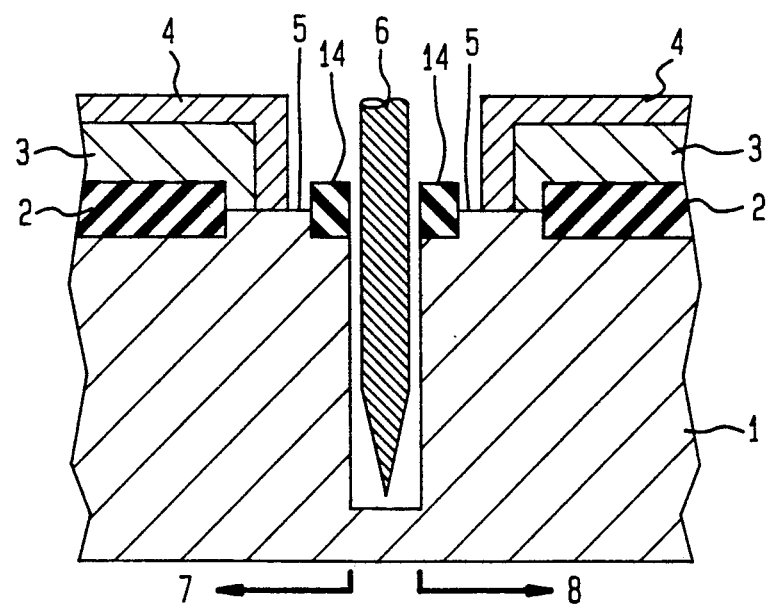

FIG. 1, FIG. 2 show a dicing method in a first embodiment of the invention.

In FIG. 1, FIG. 2, on the surface of a semiconductor wafer 1, an oxide film for semiconductor element isolation (LOCOS oxide film) 2 is selectively formed. In the region separated by the oxide film 2 on the surface of the semiconductor wafer 1, semiconductor elements such as transistors and resistors are formed, and they are mutually connected by aluminum wirings. In FIG. 1 and FIG. 2, the individual semiconductor elements and aluminum wirings are not shown, but they are collectively expressed as a semiconductor element region 3. On the surface of the semiconductor element region 3, a protective film 4 made of oxide film or nitride film is formed. Between adjacent semiconductor element regions 3, 3, scribing lines 5 are defined for dividing the semiconductor wafer 1 into plural square shaped semiconductor chips. An oxide film 14 is formed in the surface region of semiconductor wafer 1 along the center line of scribing line 5. The oxide film 14, like the other oxide film 2, is formed in such a state that it is partly buried in the surface region of semiconductor wafer 1. Meanwhile oxide film 14 in scribing line 5 is formed in a state separate from the protective film 4, which covers the surface of semiconductor element region 3.

The dicing process is performed as follows.

In FIG. 1, FIG. 2, while rotating the dicing saw 6 at high speed and moving in the direction orthogonal to the sheet of paper, the semiconductor wafer 1 is cut off along the center line of scribing line 5, and the semiconductor wafer 1 is divided by fracturing the remaining uncut depth portion of lines to form plural semiconductor chips 7, 8. A portion of oxide film 14 at the edges of line 5 remains and forms a peripheral edge or chips 7, 8.

In the dicing process, an immoderate force may be applied to semiconductor wafer 1 by dicing saw 6, but since oxide film 14 is formed along scribing line 5, the immoderate force applied from dicing saw 6 to semiconductor wafer 1 is absorbed and lessened by oxide film 14. As a result, as shown n FIG. 2, a crack is not formed in the semiconductor wafer 1 even if semiconductor wafer 1 is cut nearly to the bottom by dicing saw 6.

In the first embodiment shown in FIG. 1, FIG. 2, part of the oxide film 14 formed in the scribing line 5 is buried in the semiconductor wafer 1. Accordingly, as compared with the case of forming the protective film in the scribing lines only on the surface of the semiconductor wafer 1, as in the foregoing invention disclosed in the Japanese patent application No. Sho. 63-23068, crack formation may be more effectively inhibited.

Incidentally, if the protective film 4 for covering the surface of the semiconductor element region 3 and the oxide film 14 in the scribing line 5 are formed as one film, the force transmitted from the dicing saw 6 to the oxide film 14 is further propagated to the protective film 4 on the surface of the semiconductor element region 3, and the protective film 4 may be damaged. By contrast, when the protective film 4 for covering the surface of the semiconductor element region 3 and the oxide film 14 in the scribing line 5 are formed separately, the force applied to the oxide film 14 is not transmitted to the protective film 4. Hence, damage of the protective film 4 in the dicing process may be effectively inhibited.

Figure 3:
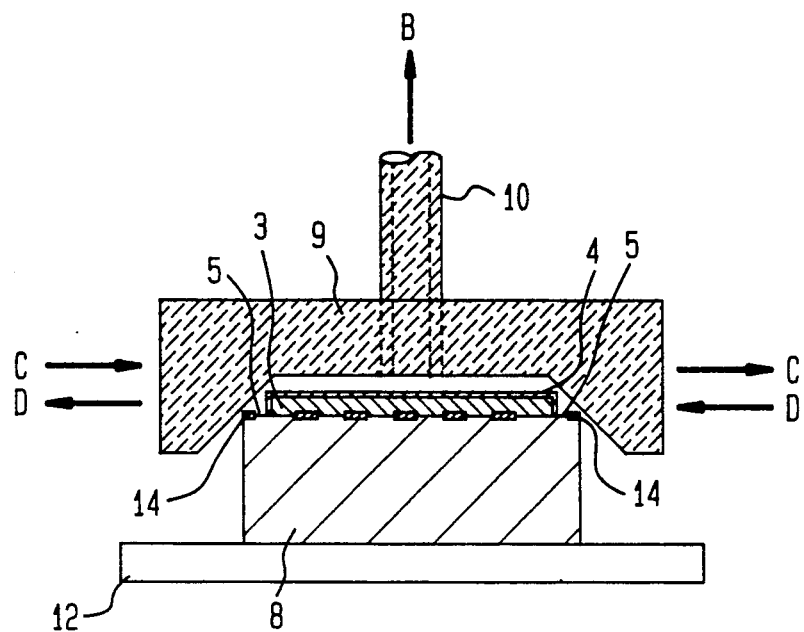
FIG. 3 is a sectional view showing a semiconductor device manufacturing method in a second embodiment of the invention.

FIG. 3 shows a die-bonding method, which is a second embodiment of the invention.

The conforming semiconductor chip 8 divided from the semiconductor wafer 1 in the dicing process shown in FIG. 1, FIG. 2 is adhered to the lead frame in the subsequent die-bonding process. As previously indicated, part of oxide film 14 is left over at the periphery of the semiconductor substrate of semiconductor chips 7, 8 obtained in the dicing process shown in FIG. 1, FIG. 2.

Accordingly, collet 9 is moved onto the conforming semiconductor chip divided by dicing, and the air in the lower side of the collet 9 is extracted in the direction of arrow B by vacuum means comprising a pipe 10 and vacuum pump (not shown) attached to the upper end of the pipe 10. As a result, semiconductor chip 8 is attracted to the lower side of the pyramidal shape of the collet, with the oxide film 14 left over at the edges of scribing lines 5 in contact with the slope of the collet 9. Accordingly, the semiconductor element region 3 and protective film 4 do not contact with the collet 9. In this state, the collet 9 is moved onto the lead frame 12, and the semiconductor chips 8 are mounted on the lead frame 12. The surface of the lead frame 12 is preliminarily coated with an adhesive (not shown) such as silver paste. Accordingly, by vibrating the collet 9 in the directions of arrows C, D while collet 9 presses the semiconductor chips 8 on to the lead frame 12, or, so to speak, scrubbing, the semiconductor chips 8 are adhered to the lead frame 12.

At this time, a force is applied to the peripheral edge of the semiconductor chip 8 by the slope of the collet 9, but this force is absorbed and lessened by the oxide film 14 left over at the edges of scribing line 5, and is hardly transmitted up to the inside of the semiconductor substrate. Hence, cracks are hardly formed in the semiconductor substrate. This effect is particularly beneficial when the periphery of the semiconductor element region 3 is formed closely to the outermost circumference of the semiconductor chip 8 (that is, when the scribing line 5 is narrow), or the aluminum wirings in the semiconductor element region 3 are formed closely to the outermost circumference of the semiconductor element region 3.

Thus, according to the embodiment in FIG. 3, formation of cracks in the semiconductor substrate, when die-bonding, is prevented, and the yield (productivity) and reliability of semiconductor devices may both be enhanced.

In particular, in the embodiment in FIG. 3, since part of the oxide film 14 is buried inside the semiconductor substrate, formation of cracks may be more effectively suppressed, as compared with the case of leaving the protective film only on the surface of semiconductor substrate, such as the semiconductor chip diced in the method disclosed in the Japanese patent application No. Sho. 63-23068.

Figure 4:
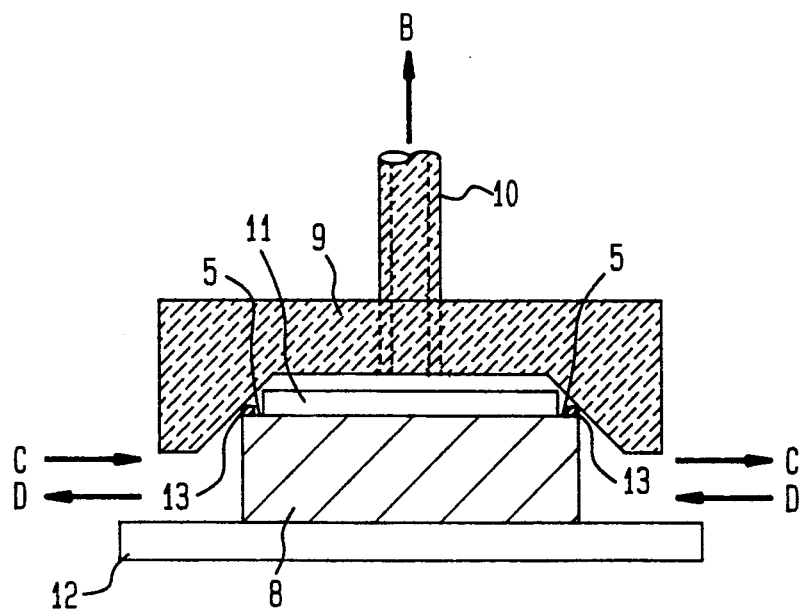
FIG. 4 is a sectional view showing a semiconductor device manufacturing method in a third embodiment of the invention.
Figure 7:
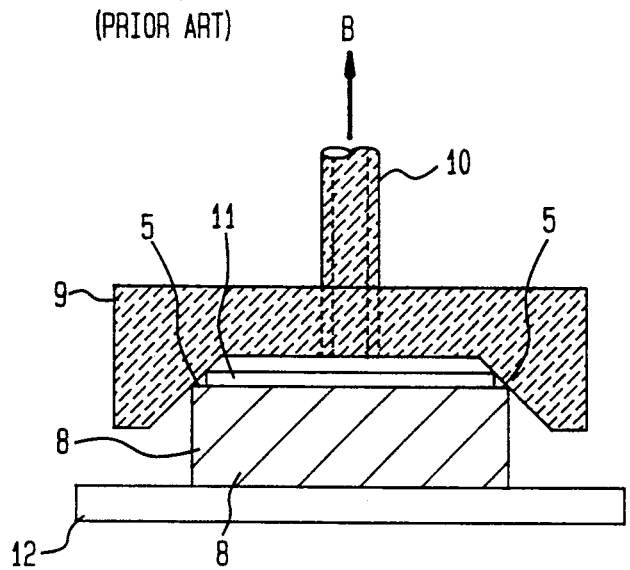
FIG. 7, FIG. 8 and FIG. 9 are sectional views showing a conventional die-bonding method.
Figure 8:
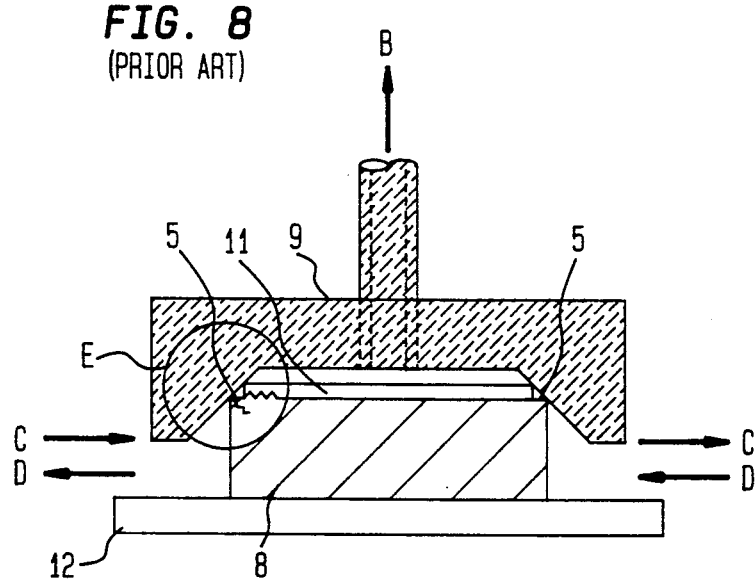
Figure 9:
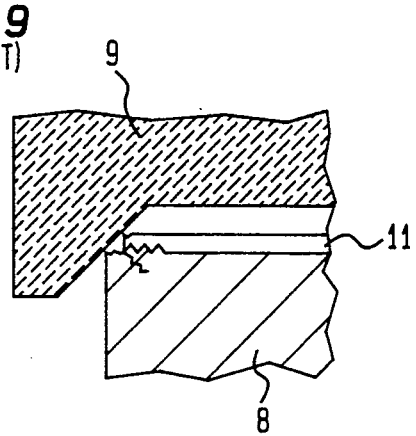

FIG. 4 shows a die-bonding method in a third embodiment of the invention. FIG. 4 shows a die-bonding method of semiconductor chip obtained in the dicing method disclosed in the Japanese patent application No. Sho. 63-23068. On the surface of the semiconductor substrate of the semiconductor chip 8, an integrated circuit part 11 comprising the oxide film 2, semiconductor element region 3 and protective film 4 shown in FIG. 1, FIG. 2 is formed. A part of the protective film 13 is left over at the edges scribing line 5. This protective film is formed in the scribing line 5 in the same process as the protective film 4 covering the surface of the semiconductor element region 3. The protective film 4 on the surface of the semiconductor element region 3 and the protective film 13 in the scribing line 5 are separated from each other. When the semiconductor wafer is cut off by a dicing saw along the scribing line 5, part of the protective film 13 at the edges of the scribing line 5 is left over on the periphery of the semiconductor chip 8 as shown in FIG. 4.

In this embodiment, too, when the semiconductor chip 8 is attracted by the collet 9, the protective film 13 left over at the edges of scribing line 5 contacts with the slope of the collet 9. In this state, the collet 9 is moved onto the lead frame 12, and the collet 9 is caused to vibrate in the directions of arrows C, D while collet 9 presses semiconductor chip 8 onto the lead frame, and the semiconductor chip 8 is thus adhered to the lead frame 12.

At this time, a force is applied to the peripheral edge of semiconductor 8 by the slope of collet 9, but the force is absorbed and lessened by the protective film 13 left over in the scribing line 5. Hence, formation of cracks in the semiconductor substrate is suppressed.

Thus, the die-bonding method of this invention may be applied to the die-bonding of semiconductor chips obtained in the dicing method disclosed in Japanese patent application No. Sho. 63-23068.

We claim:

1. A semiconductor device manufacturing method comprising:

a step of forming plural semiconductor element regions in a surface region of a semiconductor wafer, a step of forming a first protective film on the surface of said plural semiconductor element regions, a step of forming a second protective film in the surface region of said semiconductor wafer along a scribing line defined on the surface of said semiconductor conductor wafer between adjacent semiconductor element regions, wherein said second protective film is separated from said first protective film and is partly buried in said semiconductor wafer, said second protective film is an oxide film formed in the same process by which oxide films for semiconductor element isolation are formed selectively in the surface region of said semiconductor wafer, and a dicing step for cutting said semiconductor wafer along said scribing line so as to divide said semiconductor wafer into plural semiconductor chips with a portion of said second protecting film.

* * * * *